(12) United States Patent
Tangudu et al.

(10) Patent No.: US 11,029,919 B2
(45) Date of Patent: *Jun. 8, 2021

(54) INTERNALLY TRUNCATED MULTIPLIER

(71) Applicant: TEXAS INSTRUMENTS INCORPORATED, Dallas, TX (US)

(72) Inventors: Jawaharlal Tangudu, Bangalore (IN); Suvam Nandi, Bangalore (IN); Pooja Sundar, Bangalore (IN); Jaiganesh Balakrishnan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/852,710

(22) Filed: Apr. 20, 2020

(65) Prior Publication Data

US 2020/0301666 A1   Sep. 24, 2020

Related U.S. Application Data

(63) Continuation of application No. 16/454,369, filed on Jun. 27, 2019, now Pat. No. 10,635,396, which is a continuation of application No. 15/587,096, filed on May 4, 2017, now Pat. No. 10,372,415.

(30) Foreign Application Priority Data

May 4, 2016   (IN) .............. 201641015444

(51) Int. Cl.
*G06F 7/523* (2006.01)
*G06F 7/50* (2006.01)
*H03D 7/16* (2006.01)

(52) U.S. Cl.
CPC .............. *G06F 7/523* (2013.01); *G06F 7/50* (2013.01); *H03D 7/161* (2013.01)

(58) Field of Classification Search
CPC ............ G06F 7/50; G06F 7/523; H03D 7/161
See application file for complete search history.

(56) References Cited

U.S. PATENT DOCUMENTS

| | | | | |
|---|---|---|---|---|
| 5,935,198 A | * | 8/1999 | Blomgren | G06T 3/4007 708/290 |
| 6,269,385 B1 | * | 7/2001 | Han | G06F 7/4876 708/497 |
| 9,606,608 B1 | | 3/2017 | Langhammer | |
| 9,703,531 B2 | | 7/2017 | Lutz et al. | |
| 2003/0196177 A1 | * | 10/2003 | Parhi | G06F 7/5338 708/629 |
| 2007/0005677 A1 | | 1/2007 | Kishore et al. | |
| 2017/0322773 A1 | | 11/2017 | Tangudu et al. | |

* cited by examiner

*Primary Examiner* — Michael D. Yaary
(74) *Attorney, Agent, or Firm* — Brian D. Graham; Charles A. Brill; Frank D. Cimino

(57) ABSTRACT

A multiplier circuit includes a partial product generation circuit, a truncation circuit, and a summation circuit. The partial product generation circuit is configured to generate a plurality of partial products for multiplying two values. The truncation circuit is coupled to the partial product generation circuit. The truncation circuit is configured to shorten at least some of the partial products by removing a least significant bit from the at least some of the partial products. The summation circuit coupled to the truncation circuit. The summation circuit is configured to sum the truncated partial products produced by the truncation circuit.

22 Claims, 3 Drawing Sheets

INTERNALLY TRUNCATED MULTIPLIER

CROSS-REFERENCE TO RELATED APPLICATIONS

The present application is a continuation of U.S. patent application Ser. No. 16/454,369, filed Jun. 27, 2019, which is a continuation of U.S. patent application Ser. No. 15/587,096, filed May 4, 2017, now U.S. Pat. No. 10,372,415, which claims priority to Indian Provisional Patent Application No. 201641015444, filed May 4, 2016, each of which is hereby incorporated herein by reference in its entirety.

BACKGROUND

In wireless receivers, down converters transform a radio frequency (RF) signal into a baseband signal centered at the zero frequency. Down conversion has traditionally been performed in the analog domain. However, the next generation of wireless receivers may employ RF sampling, in which the RF signal is directly sampled with a high speed, high performance analog-to-digital converter (ADC) (e.g., a 14 bit, 3 giga-sample-per-second ADC). The use of RF sampling allows such receivers to employ digital down-converters (DDC) that avoid mixers in the RF/analog domain. In a DDC, mixing is implemented using digital multiplication circuitry.

SUMMARY

A multiplier with reduced circuit complexity for use in a digital downconverter, a digital upconverter, or a variety of other applications is disclosed herein. In one embodiment, a multiplier circuit includes a partial product generation circuit, a truncation circuit, and a summation circuit. The partial product generation circuit is configured to generate a plurality of partial products for multiplying two values. The truncation circuit is coupled to the partial product generation circuit. The truncation circuit is configured to shorten at least some of the partial products by removing a least significant bit from the at least some of the partial products, thereby producing truncated partial products. The summation circuit is coupled to the truncation circuit. The summation circuit is configured to sum the truncated partial products produced by the truncation circuit.

In another embodiment, a digital down converter (DDC) includes a mixer configured to multiply samples of a received radio frequency signal with samples of a down conversion frequency to produce an intermediate frequency signal. The mixer includes a multiplier to multiply the samples of the radio frequency signal with the samples of the down conversion frequency. The multiplier includes a partial product generation circuit, a truncation circuit, and a summation circuit. The partial product generation circuit is configured to generate a plurality of partial products for multiplying two values. The truncation circuit is coupled to the partial product generation circuit. The truncation circuit is configured to shorten at least some of the partial products by removing a least significant bit from the at least some of the partial products, thereby producing truncated partial products. The summation circuit is coupled to the truncation circuit. The summation circuit is configured to sum the truncated partial products produced by the truncation circuit.

In a further embodiment, a multiplier circuit includes a partial product generation circuit, a truncation circuit, a bias compensation circuit, and a summation circuit. The partial product generation circuit is configured to generate a plurality of partial products for multiplying two values. The truncation circuit is coupled to the partial product generation circuit. The truncation circuit is configured to shorten at least some of the partial products by removing a least significant bit from the at least some of partial products, thereby producing truncated partial products. The bias compensation circuit is configured to determine a bias introduced in a multiplication by operation of the truncation circuit, and to generate a bias compensation value to offset the determined bias. The summation circuit is coupled to the truncation circuit and the bias compensation circuit. The summation circuit is configured to sum the truncated partial products produced by the truncation circuit, and to add the bias compensation value to a sum of the truncated partial products.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

While digital down converters (DDCs) and digital up converters (DUC) advantageously alleviate the need for analog mixers, conventional DDCs and DUCs are subject to a variety of disadvantages. For example, because the radio frequency (RF) analog-to-digital converter (ADC) that provides data to the DDC samples at giga-sample per second (GSPS) rates, the digital circuitry needed to implement down conversion at such rates in conventional DDCs is complex and consumes a significant amount of power. The circuitry of the DUC is subject to similar issues.

Multipliers employed in conventional DDCs and DUCs are typically generated by logic synthesis tools. Many different multiplier architectures are available (e.g., multipliers in parallel, multipliers with pipelining). Unfortunately, conventional multiplier architectures tend to greatly increase in complexity as higher performance is required. Accordingly, the circuity area and/or power consumption of the multiplier may greatly increase as higher performance is required.

Embodiments of the digital mixer disclosed herein reduce circuit complexity relative to conventional mixers by implementing an efficient multiplier architecture. The multiplier of the present disclosure reduces circuity area by truncating partial products generated by the multiplier prior to summation, and reducing, relative to conventional multipliers, the multiplier's partial product summation circuitry to accommodate the truncated partial products. Truncation of partial products results in quantization noise that includes a DC bias component and a random noise component. Embodiments of the multiplier disclosed herein include bias compensation that computes a bias compensation value and adds the bias compensation value to the product to mitigate the effects of DC bias in the truncated partial products.

Figure 1:
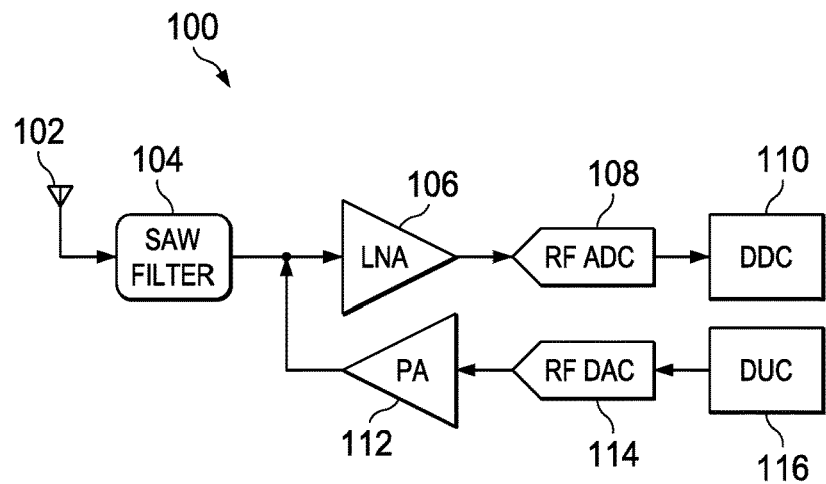
FIG. 1 shows a block diagram of a radio frequency (RF) sampling analog to digital converter based RF transceiver in accordance with various embodiments.

FIG. 1 shows a block diagram of a radio frequency (RF) sampling analog-to-digital converter based RF transceiver 100 in accordance with various embodiments. The transceiver 100 includes an antenna 102 and a surface acoustic wave (SAW) filter 104. The receive path of the transceiver 100 includes a low noise amplifier (LNA) 106, a radio frequency (RF) analog-to-digital converter (ADC) 108, and a digital down converter (DDC) 110. The transmit path of the transceiver 100 includes a power amplifier 112, an RF digital-to-analog converter (DAC) 114, and a digital up converter (DUC) 116.

The antenna 102 converts RF signals between conducted and airwave form. The SAW filter 104 may operate as a preselection filter to limit the frequency band of RF signals input to the LNA 106. The LNA 106 amplifies received RF signals prior to digitization of the RF signals by the RF ADC 108. The RF ADC 108 converts analog RF signals into digital samples at a high rate (e.g., 3 GSPS) and with high bit resolution (e.g., 14 bits). The DDC 110 downconverts the digitized RF signals to base-band or to one or more selected intermediate frequency. Embodiments of the DDC 110 may include a multiplier that truncates partial products to reduce circuit area.

The DUC 116 upconverts, to an RF carrier frequency, digital signals to be transmitted. Embodiments of the DUC 116 may include a multiplier that truncates partial products to reduce circuit area. The digital RF frequency signals generated by the DUC 116 are converted to analog RF signals by the RF DAC 114. The analog RF signals generated by the RF DAC 114 are amplified by the power amplifier 112 and driven to the antenna 102 for transmission.

Figure 2:
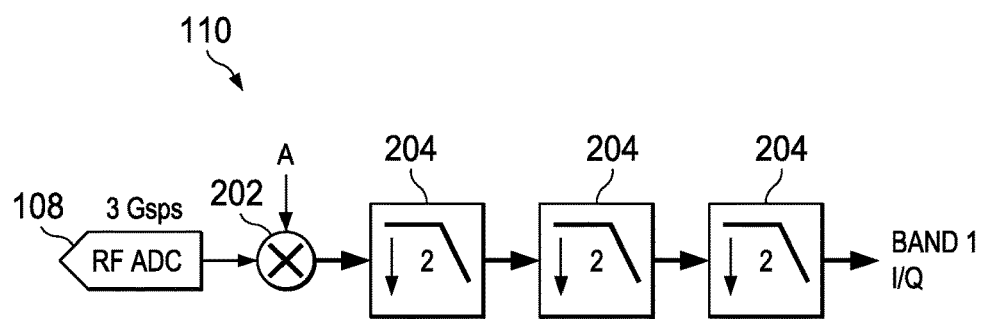
FIG. 2 shows a block diagram of a digital down converter (DDC) in accordance with various embodiments.

FIG. 2 shows a block diagram of the DDC 110 in accordance with various embodiments. In FIG. 2, the RF ADC 108 is shown for completeness. The DDC 110 includes a digital multiplier (i.e., a digital multiplier circuit) 202, and one or more decimation filters 204 coupled to the output of the multiplier 202. The multiplier 202 is part of a mixer that applies an RF frequency F1 to shift the RF frequency samples generated by the RF ADC 202 and convert the signal to base-band domain. The multiplier 202 multiplies the RF signal samples generated by the RF ADC 108 with samples of the frequency F1. The multiplier 202 may produce in-phase and quadrature phase signal outputs by multiplying the RF signal samples generated by the RF ADC 108 with sine and cosine samples of the frequency F1. Accordingly, the multiplier 202 may include a pair of multipliers, one for sine multiplication and another for cosine multiplications, or a single multiplier that is capable of performing multiplication for both sine and cosine functions. Because the multiplier 202 operates at twice the rate at which input samples are provided to the multiplier 202, and the input rate may be very high, the power consumption and circuit area of conventional multipliers in a mixer may be very high. The multiplier 202 may include truncation of partial products to reduce mixer circuit area as disclosed herein.

The decimation filters 204 reduce the bandwidth and the rate of samples received from the multiplier 202. Any number of decimation filters 204 may be sequentially coupled to provide a desired output sample rate. For example, in the DDC 110 shown in FIG. 2, three decimation filters 204 are cascaded to reduce the sampling rate of the downconverted signal by a factor of six.

Figure 3:
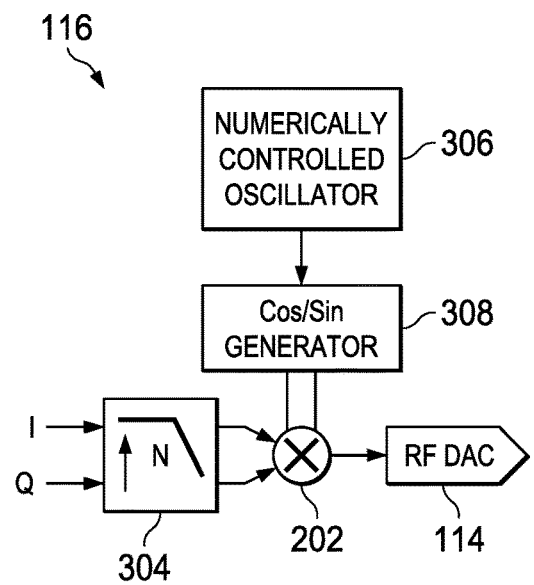
FIG. 3 shows a block diagram of a digital up converter (DUC) in accordance with various embodiments.

FIG. 3 shows a block diagram of the DUC 116 in accordance with various embodiments. In FIG. 3, the RF DAC 114 is shown for completeness. The DUC 116 includes an interpolation filter 304, a multiplier 202, a cosine/sine generator 308, and a numerically controlled oscillator 306. The interpolation filter 304 receives in-phase and quadrature phase of a signal to be transmitted. The interpolation filter 304 upsamples the signals to produce output signals at a higher sampling rate. The upsampled signals are provided to the multiplier 202. The multiplier 202 functions as a mixer to shift the upsampled signals generated by the interpolation filters 304 to a carrier frequency provided as samples from the cosine/sine generator 308 at a frequency generated by the numerically controlled oscillator 306. The multiplier 202 may include truncation of partial products to reduce circuit area as disclosed herein. The upconverted signal samples generated by the multiplier 202 are converted to an analog signal by the RF DAC 114.

Figure 4:
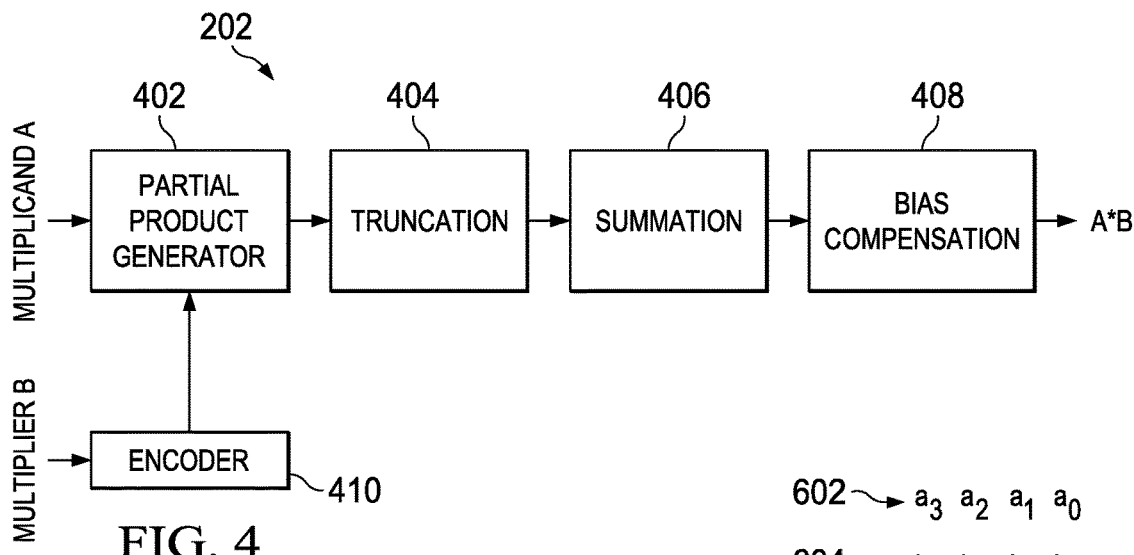
FIG. 4 shows a block diagram of a multiplier that includes partial product truncation in accordance with various embodiments.

FIG. 4 shows a block diagram of the multiplier 202 in accordance with various embodiments. The multiplier 202 includes a partial product generation circuit 402, a truncation circuit 404, a summation circuit 406, a bias compensation circuit 408, and an encoder 410. The multiplier 202 receives as input a multiplicand and a multiplier. The partial product generation circuit 402 produces the partial product values for multiplication of the input multiplicand and multiplier. The encoder 410 may recode the multiplier to reduce the number of partial products to be produced by the partial product generation circuit 402. For example, the encoder 410 may apply Booth's encoding to the multiplier, and the partial product generation circuit 402 may produce a number of partial products in accordance with the multiplier values generated by the encoder 410.

Figure 6:
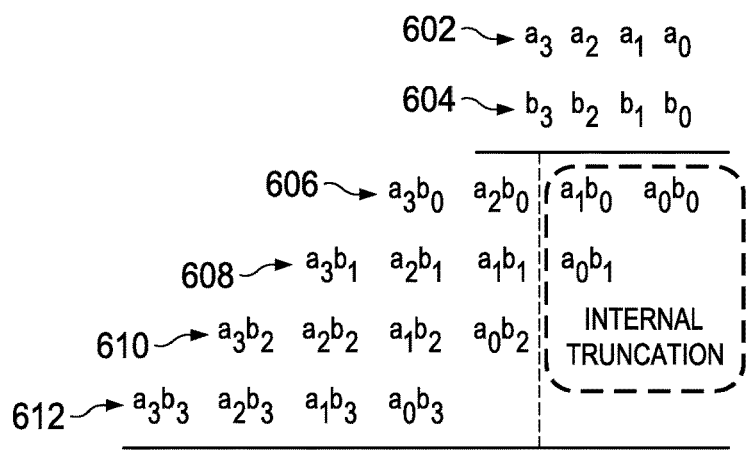
FIG. 6 shows an example of truncation of partial products in a multiplier in accordance with various embodiments.

The truncation circuit 404 receives the partial products generated by the partial product generation circuit 402 and shortens at least some of the partial products by dropping one or more least significant bits from the partial product. FIG. 6 shows an example of truncation of partial products by the truncation circuit 404. While FIG. 6 illustrates partial products generated by shift and add multiplication, similar principles apply to truncation of the partial products generated by Booth multiplication. In FIG. 6, two 4-bit values are multiplied to produce an 8-bit result. Because only four bits of the product are need for computation downstream of the multiplier 202, the truncation circuit 404 drops two least significant bits from the partial products to generate a six bit result that can be rounded down to four bits. Thus, two bits are dropped from the partial product 606, one bit is dropped from the partial product 608, and no bits are dropped from partial products 610 and 612. By dropping one or more of the least significant bits of the partial products, the width (and area) of the summation circuit 406 may be reduced to accommodate six rather than eight bits.

The summation circuit 406 receives the truncated partial products from the truncation circuit 404 and sums the truncated partial products to generate the multiplication product. Truncation of the partial products may introduce a bias in the multiplication product. The bias compensation circuit 408 adjusts the multiplication product to compensate for the bias introduced by partial product truncation. The bias compensation circuit 408 may compensate for bias caused by partial product truncation by adding a bias compensation value to the multiplication product. Truncation of the partial products causes quantization error that is tolerable in many applications. The number of least significant bits truncated in each partial product can be selected based on the tolerable level of quantization error.

Embodiments of the bias compensation circuit 408 may determine the bias compensation value as a constant if the values of the multiplicand and multiplier are random, or as a count of the number of partial products truncated if the multiplicand and multiplier are not random. For example, if the partial product generation circuit 402 produces partial products for a 16×16 multiplication, and only 16 bits of multiplication product are needed by downstream logic, then in a conventional multiplier, 16 LSBs of the 32 bit output are rounded off to produce a final 16 bit output. In the multiplier 202, the 16 partial products may be truncated to drop 10 LSBs. The truncated partial products are summed, bias is removed and the product is rounded by removing 6 LSBs. In this example, of the 16 partial products, only 10 partial products are affected by truncation whereas the remaining 6 partial products corresponding to the MSBs of the multiplier are not affected by truncation. For this example, operation of the multiplier 202 may be expressed as:

$$TruncMultOut = \text{floor}\left(a * \frac{b(0)}{2^{10}}\right) + \text{floor}\left(2a * \frac{b(1)}{2^{10}}\right) +$$
$$\text{floor}\left(4a * \frac{b(2)}{2^{10}}\right) + \ldots + \text{floor}\left(2^{15}a * \frac{b(15)}{2^{10}}\right)$$

$$BiasRemovedMultOut = TruncMultOut - Bias$$

$$FinalOut = \text{round}\left(\frac{BiasRemovedMultOut}{2^6}\right)$$

where:
a is the multiplicand;
b(0) . . . b(15) are the bits of the multiplier with b(0) being the LSB;
TruncMultOut is the sum of truncated partial products;
BiasRemovedMultOut is the bias compensated sum of truncated partial products;
Bias is the bias compensation value; and
FinalOut is the rounded multiplication product output by the multiplier 202.

As noted above, the bias compensation value may be provided as a constant if the multiplicand and multiplier are random. Considering the 16-bit multiplication example above, with 10 bits of truncation, there will be 10 truncation noise sources corresponding to b(0) to b(9). On average, only 5 of the noise sources is present per multiplication assuming the multiplier is a random value and only 5 out of 10 bits will be non-zero. Each truncation will introduce ½ LSB DC bias. So effective DC bias is 5*½=2.5 LSBs. To remove this DC bias, the bias compensation circuit 408 may set the bias compensation value to 2, so that a constant DC bias of 2 is subtracted from the sum of truncated partial products. This bias compensation method can be used for Booth coding and any other multiplication coding scheme (e.g., Wallace tree).

Embodiments may also employ dynamic bias determination. In dynamic bias determination, for every valid set of non-zero bits truncated, the bias compensation value is incremented by one. The bias is a function of the multiplier and does not depend on the multiplicand. The value of the multiplier determines the number of truncation sources and hence the bias is dependent on the value of the multiplier. Accordingly, for the 16-bit example above, with 10 bits of truncation, the number of truncation sources depends on how many bits among b(0) to b(9) (LSBs of multiplier) are non-zero. The bias compensation circuit 408 may compute the number of truncation sources by counting the number of non-zero bits in b(0) to b(9) and computing the DC bias (i.e., the bias compensation value) as half of the number of truncation sources, since each truncation source causes ½ LSB DC bias. This bias compensation method works for static and dynamic multiplier values, and assumes that only the multiplicand is random. This strategy can be used for Booth coded multiplier scheme and any other multiplier coding scheme.

Table 1 below shows a comparison of bias present in a multiplication product for a 16×17 multiplier with no truncation and with 12 bits of partial product truncation using constant and dynamic bias compensation.

TABLE 1

| Multiplier Product Bias | | | |
|---|---|---|---|
| | Random Inputs | Static Multiplier | Fixed Inputs |
| No Truncation | No Bias | No Bias | −93 dBFS |
| Constant Bias Compensation | No Bias | −95 dBFS | −88 dBFS |
| Dynamic Bias Compensation | No Bias | No Bias | −85 dBFS |

Figure 5:
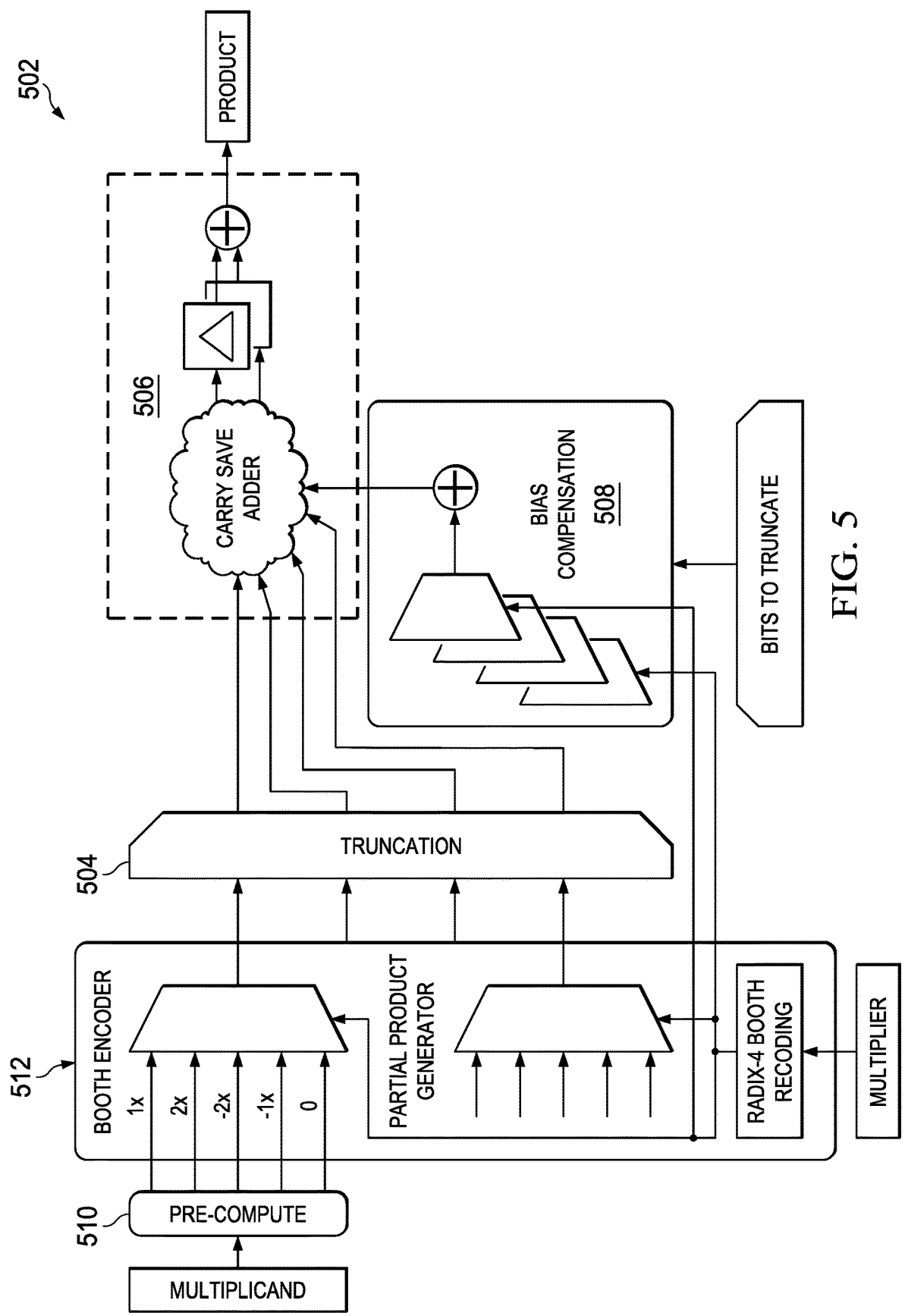
FIG. 5 shows a block diagram of a Booth multiplier that includes partial product truncation in accordance with various embodiments.

FIG. 5 shows a block diagram of a multiplier 502 that includes partial product truncation in accordance with various embodiments. The multiplier 502 is an embodiment of the multiplier 202. The multiplier 502 implements multiplication using a radix-4 Booth technique to reduce the number of partial products generated. Other embodiments may employ different multiplication techniques, and embodiments of the multiplier 502 with internal truncation of partial products are applicable to any multiplier architecture. The multiplier 502 includes a partial product generator 512, partial product pre-computation circuitry 510, truncation circuitry 504, bias compensation circuitry 508, and summation circuitry 506. The partial product generator 512 is based on radix-4 Booth encoder algorithm. The partial product pre-computation circuitry 510 computes variants of each multiplicand that may be employed by the radix-4 Booth encoding implemented by the partial product generator 512. The partial product generator 512 recodes the multiplier as required for radix-4 Booth multiplication. E.g., the bits of the multiplier may be assigned to groupings of the three bits. The partial product generator 512 applies the recoded multiplier (e.g., the three bit values) to select one of the pre-computed partial products and shift it to a selected bit position as the partial product outputs provided to the truncation circuitry 504.

The truncation circuit 504 is an embodiment of the truncation circuit 404. The truncation circuit 504 truncates a predetermined number of bits from the partial products as described herein with respect to the truncation circuit 404. The truncated partial products are provided to the summation circuit 506. The summation circuit 506 is an embodiment of the summation circuit 406. The summation circuit 506 may be implemented as a carry save adder. The width of the carry save adder is sufficient to sum the truncated partial products and not sufficient to sum the untruncated partial products.

The bias compensation circuit 508 is an embodiment of the bias compensation circuit 408. The bias compensation circuit 508 determines a bias compensation value to use to correct for bias introduced in the multiplication product by the truncation of partial products. As explained above, the bias compensation value may be a constant that is a function of the number of partial products truncated (e.g., ¼ the number of partial products truncated), or the bias compensation value may be dynamically computed based on the bits of the multiplier (e.g., the bits of the radix-4 recoded multiplier) and determining the number of partial products that are truncated. The bias compensation circuit 508 provides the bias compensation value to the summation circuit 506 and the summation circuit 506 adds (e.g., adds the two's complement of the bias compensation value) to the sum of truncated partial products to correct for bias introduced by the truncation.

As an example of operation a 16×16 implementation of the multiplier 504, let "a" be the multiplicand and "b" be the multiplier. Because the multiplier 502 is a radix-4 implementation, the number of partial products is nine rather than sixteen as in a shift and add implementation. The 16-bit multiplier "b" is split into 9 overlapping Blocks. Each Block contains three bits and is shifted by two bits from the previous Block. The Blocks are listed in the table below.

TABLE 2

3 bit Blocks in Radix-4 Booth Encoding of 16-bit multiplier

| Blocks |
|---|
| b(1), b(0), 0 |
| b(3), b(2), b(1) |
| b(5), b(4), b(3) |
| b(7), b(6), b(5) |
| b(9), b(8), b(7) |
| b(11), b(10), b(9) |
| b(13), b(12), b(11) |
| b(15), b(14), b(13) |
| 0, 0, b(15) |

For each Block, based on the three bits the corresponding partial product can be one of the five possible values shown in the below table. The partial products will be referred to as p(0) to p(9).

TABLE 3

Block value to partial product mapping

| Block | Partial Product |
|---|---|
| 000 | 0 |
| 001 | 1 * Multiplicand |
| 010 | 1 * Multiplicand |

TABLE 3-continued

Block value to partial product mapping

| Block | Partial Product |
|---|---|
| 011 | 2 * Multiplicand |
| 100 | −2 * Multiplicand |
| 101 | −1 * Multiplicand |
| 110 | −1 * Multiplicand |
| 111 | 0 |

Booth Coded Multiplier output with full precision can be obtained as a sum of partial products shifted to the appropriate bit position is shown below.

$$\text{MultOutputFull} = p(0) + 4p(1) + 16p(2) + \ldots + 2^{16}p(8)$$

The output may be rounded as:

$$\text{FinalOut} = \text{round}\left(\frac{\text{MultOutputFull}}{2^{16}}\right)$$

In the multiplier 502, with 10 bit internal truncation:

$$\text{TruncMultOut} = \text{floor}\left(\frac{p(0)}{2^{10}}\right) + \text{floor}\left(4 * \frac{p(1)}{2^{10}}\right) + \text{floor}\left(16 * \frac{p(2)}{2^{10}}\right) + \ldots + \text{floor}\left(2^{16} * \frac{p(8)}{2^{10}}\right)$$

$$\text{BiasRemovedMultOut} = \text{TruncMultOut} - \text{Bias}$$

$$\text{FinalOut} = \text{round}\left(\frac{\text{BiasRemovedMultOut}}{2^6}\right)$$

Figure 7:
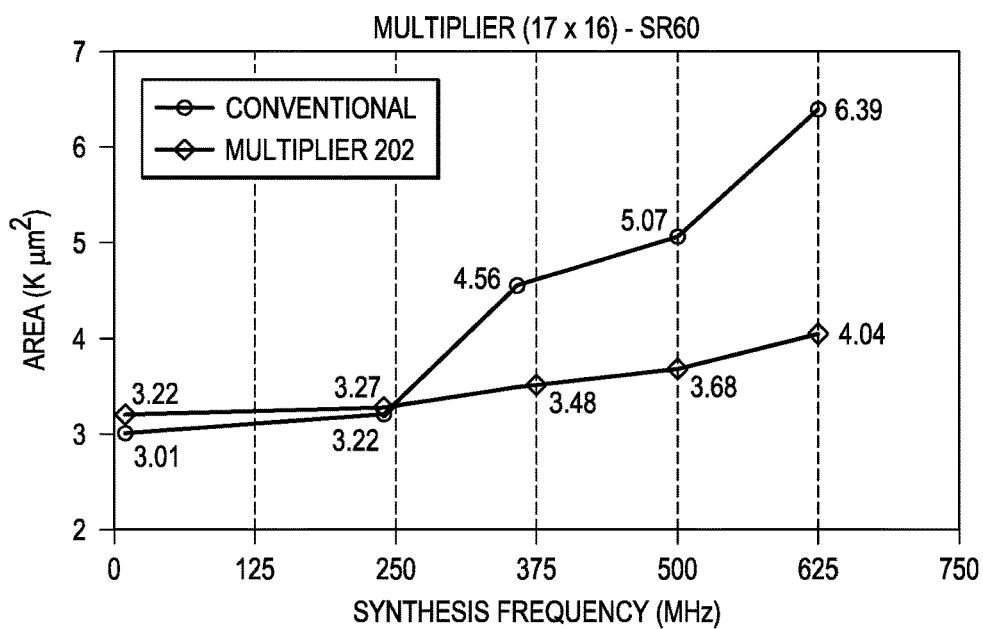
FIG. 7 shows circuit area versus operation frequency for a multiplier that includes partial product truncation in accordance with various embodiments.

FIG. 7 shows circuit area versus operation frequency for a multiplier 202 that includes partial product truncation of ten bits. As shown in FIG. 7, for a 17-bit by 16-bit multiplier implemented in a given process (e.g., 60 um), the circuit areas of the conventional multiplier and the multiplier 202 diverge sharply above about 250 MHz. For example, at synthesis frequency of 500 megahertz, the circuit area of the multiplier 202 is about 27% smaller than the circuit area of the conventional multiplier. Accordingly, the multiplier 202 can provide equivalent performance to the conventional multiplier while providing a substantial reduction in circuit area.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A circuit comprising:
   a multiplication circuit configured to provide a product of a multiplier and a multiplicand, such that the product has a first number of bits, wherein the multiplication circuit includes:
      an encoder configured to:
         receive the multiplier; and
         apply Booth's encoding to the multiplier to produce a Booth's encoded multiplier;
      a partial product generator coupled to the encoder and configured to:
         receive the Booth's encoded multiplier and the multiplicand; and generate a set of partial products for the Booth's encoded multiplier and the multiplicand;
a truncation circuit coupled to the partial product generator and configured to:
receive the set of partial products; and
remove a set of least significant bits from a subset of the set of partial products to produce a set of truncated partial products;
an adder coupled to the truncation circuit and configured to add the set of truncated partial products to produce a first intermediate product; and
a bias compensation circuit coupled to the truncation circuit and configured to:
determine a count of non-zero bits that have been removed from the subset of the set of partial products by the truncation circuit;
determine a bias compensation value that is a function of the count; and
add the bias compensation value to the first intermediate product to produce a second intermediate product, wherein the second intermediate product has second number of bits that is greater than the first number of bits, and the multiplication circuit is configured to round the second intermediate product to produce the product having the first number of bits.

2. The circuit of claim 1 further comprising a digital down converter that includes a mixer that includes the multiplication circuit, wherein the mixer is configured to:
receive a radio frequency signal and a down conversion signal having a reference frequency;
provide the radio frequency signal and a function of the down conversion signal to the multiplication circuit as the multiplicand and the multiplier; and
provide the product as an intermediate frequency signal.

3. The circuit of claim 2, wherein the radio frequency signal is a digitized radio frequency signal, the circuit further comprising:
an amplifier configured to couple to an antenna to receive a first signal from the antenna; and
an analog-to-digital converter configured to receive the first signal and digitize the first signal to produce the digitized radio frequency signal.

4. The circuit of claim 1 further comprising a digital up converter that includes a mixer that includes the multiplication circuit, wherein the mixer is configured to:
receive a first signal to be transmitted and a function of an oscillator signal; and
provide the first signal to be transmitted and the function of the oscillator signal to the multiplication circuit as the multiplicand and the multiplier.

5. The circuit of claim 4 further comprising:
a digital-to-analog converter coupled to the multiplication circuit and configured to:
receive the product; and
convert the product to an intermediate analog signal; and
a power amplifier coupled to the digital-to-analog converter to receive the intermediate analog signal and configured to couple to an antenna.

6. The circuit of claim 1, wherein:
the bias compensation circuit is configured to determine that the multiplier and the multiplicand are statistically random; and
the determining the count of non-zero bits that have been removed and the determining the bias compensation value that is a function of the count are performed in response to determining that the multiplier and the multiplicand are statistically random.

7. The circuit of claim 6, wherein the bias compensation circuit is configured to determine the bias compensation value as a constant in response to determining that the multiplier and the multiplicand are not statistically random.

8. The circuit of claim 1, wherein the bias compensation value equals the count multiplied by a bias multiplier.

9. The circuit of claim 8, wherein the bias multiplier is equal to ½.

10. The circuit of claim 2, wherein:
the multiplication circuit is a first multiplication circuit;
the function is a cosine function;
the mixer includes a second multiplication circuit; and
the mixer is configured to:
provide the product of the first multiplication circuit as an in-phase component of the intermediate frequency signal;
provide the radio frequency signal and a sine function of the down conversion signal to the second multiplication circuit; and
provide the product of the second multiplication circuit as a quadrature component of the intermediate frequency signal.

11. The circuit of claim 2, wherein:
the function is a cosine function; and
the mixer is configured to:
provide a product of the radio frequency signal and the cosine function of the down conversion signal as an in-phase component of the intermediate frequency signal;
provide the radio frequency signal and a sine function of the down conversion signal to the multiplication circuit; and
provide a product of the radio frequency signal and the sine function of the down conversion signal as a quadrature component of the intermediate frequency signal.

12. A circuit comprising:
a multiplication circuit configured to provide a product of a multiplier and a multiplicand, such that the product has a first number of bits, wherein the multiplication circuit includes:
a partial product generator configured to:
receive the multiplier and the multiplicand; and
generate a set of partial products for the multiplier and the multiplicand;
a truncation circuit coupled to the partial product generator and configured to:
receive the set of partial products; and
remove a set of least significant bits from a subset of the set of partial products to produce a set of truncated partial products;
an adder coupled to the truncation circuit and configured to add the set of truncated partial products to produce a first intermediate product; and
a bias compensation circuit coupled to the truncation circuit and configured to:
determine a count of non-zero bits that have been removed from the subset of the set of partial products by the truncation circuit;
determine a bias compensation value that is a function of the count; and
add the bias compensation value to the first intermediate product to produce a second intermediate product, wherein the second intermediate product has second number of bits that is greater than the first number of bits, and the multiplication circuit is configured to round the second intermediate product to produce the product having the first number of bits.

13. The circuit of claim 12 further comprising a partial product pre-computation circuit coupled to the partial product generator and configured to provide the multiplicand to the partial product generator as a set of radix-4 variants of the multiplicand.

14. The circuit of claim 13, wherein the partial product generator is configured to perform a radix-4 Booth technique to generate the set of partial products.

15. The circuit of claim 14, wherein:
the partial product generator includes a recoding circuit configured to perform radix-4 recoding of the multiplier; and
the bias compensation circuit is coupled to receive an output of the recoding circuit and configured to determine the bias compensation value based on the output of the recoding circuit.

16. The circuit of claim 12 further comprising a digital down converter that includes a mixer that includes the multiplication circuit, wherein the mixer is configured to:
receive a radio frequency signal and a down conversion signal at a reference frequency;
provide the radio frequency signal and a function of the down conversion signal to the multiplication circuit as the multiplicand and the multiplier; and
provide the product as an intermediate frequency signal.

17. The circuit of claim 16, wherein the radio frequency signal is a digitized radio frequency signal, the circuit further comprising:
an amplifier configured to couple to an antenna to receive a first signal from the antenna; and
an analog-to-digital converter configured to receive the first signal and digitize the first signal to produce the digitized radio frequency signal.

18. The circuit of claim 12 further comprising a digital up converter that includes a mixer that includes the multiplication circuit, wherein the mixer is configured to:
receive a signal to be transmitted and a function of an oscillator signal; and
provide the signal to be transmitted and the function of the oscillator signal to the multiplication circuit as the multiplicand and the multiplier.

19. The circuit of claim 12 further comprising a digital up converter that includes a mixer that includes the multiplication circuit, wherein the mixer is configured to:
receive a first signal to be transmitted and an oscillator signal; and
provide the first signal to be transmitted and the oscillator signal to the multiplication circuit as the multiplicand and the multiplier.

20. The circuit of claim 12, wherein:
the bias compensation circuit is configured to determine that the multiplier and the multiplicand are statistically random; and
the determining the count of non-zero bits that have been removed and the determining the bias compensation value that is a function of the count are performed in response to determining that the multiplier and the multiplicand are statistically random.

21. The circuit of claim 20, wherein the bias compensation circuit is configured to determine the bias compensation value as a constant in response to determining that the multiplier and the multiplicand are not statistically random.

22. The circuit of claim 12, wherein the bias compensation value equals the count multiplied by a bias multiplier.

* * * * *